(12) United States Patent
Stowell

(10) Patent No.: US 7,842,355 B2
(45) Date of Patent: Nov. 30, 2010

(54) SYSTEM AND METHOD FOR MODULATION OF POWER AND POWER RELATED FUNCTIONS OF PECVD DISCHARGE SOURCES TO ACHIEVE NEW FILM PROPERTIES

(75) Inventor: Michael W. Stowell, Loveland, CO (US)

(73) Assignee: Applied Materials, Inc., SantaClara, CA (US)

(*) Notice: Subject to any disclaimer, the term of this patent is extended or adjusted under 35 U.S.C. 154(b) by 549 days.

(21) Appl. No.: 11/264,596

(22) Filed: Nov. 1, 2005

(65) Prior Publication Data
US 2007/0098916 A1    May 3, 2007

(51) Int. Cl.
C23C 8/00    (2006.01)
C23C 16/00    (2006.01)

(52) U.S. Cl. ............... 427/569; 427/470; 427/248.1
(58) Field of Classification Search .............. None
See application file for complete search history.

(56) References Cited

U.S. PATENT DOCUMENTS

| | | | |
|---|---|---|---|
| 521,638 | A | 6/1894 | Cleal |
| 4,356,073 | A | 10/1982 | McKelvey |
| 4,407,713 | A | 10/1983 | Zega |
| 4,417,968 | A | 11/1983 | McKelvey |
| 4,422,916 | A | 12/1983 | McKelvey |
| 4,443,318 | A | 4/1984 | McKelvey |
| 4,445,997 | A | 5/1984 | McKelvey |
| 4,466,877 | A | 8/1984 | McKelvey |
| 4,519,885 | A | 5/1985 | Innis |
| 4,837,185 | A * | 6/1989 | Yau et al. ............... 438/786 |
| 4,904,362 | A | 2/1990 | Gaertner |
| 4,927,515 | A | 5/1990 | Keith |
| 4,931,169 | A | 6/1990 | Scherer et al. |
| 5,047,131 | A | 9/1991 | Wolfe |

(Continued)

FOREIGN PATENT DOCUMENTS

DE    3229969 A1    4/1983

(Continued)

OTHER PUBLICATIONS

Literature search: Power Modulation of PECVD, Source: Physics Abstract 1984-Current, 15 Pages.

(Continued)

*Primary Examiner*—Timothy H Meeks
*Assistant Examiner*—Joseph Miller, Jr.
(74) *Attorney, Agent, or Firm*—Cooley LLP

(57) ABSTRACT

A method of generating a film during a chemical vapor deposition process is disclosed. One embodiment includes generating a first electrical pulse having a first pulse amplitude; using the first electrical pulse to generate a first density of radicalized species; disassociating a feedstock gas using the radicalized species in the first density of radicalized species, thereby creating a first deposition material; depositing the first deposition material on a substrate; generating a second electrical pulse having a second pulse amplitude, wherein the second pulse amplitude is different from the first pulse width; using the second electrical pulse to generate a second density of radicalized species; disassociating a feedstock gas using the radicalized species in the second density of radicalized species, thereby creating a second deposition material; and depositing the second plurality of deposition materials on the first deposition material.

21 Claims, 9 Drawing Sheets

U.S. PATENT DOCUMENTS

| | | | | |
|---|---|---|---|---|
| 5,096,562 | A | 3/1992 | Boozenny | |
| 5,100,527 | A | 3/1992 | Stevenson | |
| 5,106,474 | A | 4/1992 | Dickey | |
| 5,108,574 | A | 4/1992 | Kirs | |
| 5,115,450 | A * | 5/1992 | Arcuri | 375/219 |
| 5,156,727 | A | 10/1992 | Bjornard | |
| 5,158,660 | A | 10/1992 | Devigne | |
| 5,169,509 | A | 12/1992 | Latz et al. | |
| 5,171,411 | A | 12/1992 | Hillendahl | |
| 5,200,049 | A | 4/1993 | Stevenson | |
| 5,213,672 | A | 5/1993 | Hartig | |
| 5,231,057 | A * | 7/1993 | Doki et al. | 438/637 |
| 5,262,032 | A | 11/1993 | Hartig | |
| 5,338,422 | A | 8/1994 | Belkind | |
| 5,344,792 | A * | 9/1994 | Sandhu et al. | 438/660 |
| 5,354,446 | A | 10/1994 | Kida | |
| 5,364,518 | A | 11/1994 | Hartig | |
| 5,384,021 | A | 1/1995 | Thwaites | |
| 5,385,578 | A | 1/1995 | Bush et al. | |
| 5,445,721 | A | 8/1995 | Bower | |
| 5,464,518 | A | 11/1995 | Sieck | |
| 5,470,452 | A | 11/1995 | Dickey | |
| 5,487,821 | A | 1/1996 | Sieck | |
| 5,518,592 | A | 5/1996 | Bower | |
| 5,527,439 | A | 6/1996 | Sieck | |
| 5,539,272 | A | 7/1996 | Taylor | |
| 5,558,750 | A | 9/1996 | Szczyrbowski | |
| 5,562,952 | A * | 10/1996 | Nakahigashi et al. | 427/534 |
| 5,563,734 | A | 10/1996 | Wolfe | |
| 5,567,289 | A | 10/1996 | Taylor | |
| 5,571,393 | A | 11/1996 | Taylor | |
| 5,591,314 | A | 1/1997 | Morgan | |
| 5,616,225 | A | 4/1997 | Sieck | |
| 5,620,577 | A | 4/1997 | Taylor | |
| 5,643,638 | A * | 7/1997 | Otto et al. | 427/569 |
| 5,645,699 | A | 7/1997 | Sieck | |
| 5,648,293 | A * | 7/1997 | Hayama et al. | 438/485 |
| 5,683,558 | A | 11/1997 | Sieck | |
| 5,688,388 | A | 11/1997 | Bahr | |
| 5,718,967 | A * | 2/1998 | Hu et al. | 428/216 |
| 5,725,746 | A | 3/1998 | Dickey | |
| 5,814,195 | A | 9/1998 | Lehan | |
| 5,968,328 | A | 10/1999 | Teschner | |
| 5,985,375 | A * | 11/1999 | Donohoe et al. | 427/492 |
| 6,177,148 | B1 | 1/2001 | Walther et al. | |
| 6,309,978 | B1 * | 10/2001 | Donohoe et al. | 438/710 |
| 6,365,009 | B1 | 4/2002 | Ishibashi | |
| 6,365,010 | B1 | 4/2002 | Hollars | |
| 6,375,815 | B1 | 4/2002 | Lynn | |
| 6,475,354 | B1 | 11/2002 | Toyama | |
| 6,635,154 | B2 | 10/2003 | Johnson et al. | |
| 6,720,037 | B2 | 4/2004 | Aota et al. | |
| 6,860,973 | B2 | 3/2005 | Willms et al. | |
| 2001/0021422 | A1 * | 9/2001 | Yamakoshi et al. | 427/569 |
| 2001/0047936 | A1 | 12/2001 | McLeod | |
| 2002/0029959 | A1 | 3/2002 | Yo et al. | |
| 2002/0073924 | A1 * | 6/2002 | Chiang et al. | 118/723 R |
| 2002/0092766 | A1 | 7/2002 | Lampkin | |
| 2002/0096257 | A1 * | 7/2002 | Wang et al. | 156/345.48 |
| 2002/0189939 | A1 | 12/2002 | German | |
| 2003/0068531 | A1 * | 4/2003 | Hori et al. | 428/696 |
| 2003/0136672 | A1 | 7/2003 | Barrett | |
| 2004/0026235 | A1 | 2/2004 | Stowell | |
| 2004/0112735 | A1 | 6/2004 | Saigal et al. | |
| 2004/0127725 | A1 * | 7/2004 | Rossen et al. | 549/213 |
| 2004/0137725 | A1 * | 7/2004 | Cheah et al. | 438/687 |

FOREIGN PATENT DOCUMENTS

| | | |
|---|---|---|
| DE | 3821207 A1 | 12/1989 |
| DE | 4117368 A1 | 12/1992 |
| DE | 4342766 A1 | 6/1995 |
| DE | 4418906 A1 | 12/1995 |
| DE | 19623359 A1 | 2/1997 |
| DE | 196 16 187 A1 | 5/1997 |
| DE | 19651378 A1 | 6/1998 |
| DE | 197 17 127 A1 | 10/1998 |
| DE | 19610253 C2 | 1/1999 |
| DE | 4117367 C2 | 11/1999 |
| DE | 4126236 C2 | 1/2000 |
| DE | 4117518 C2 | 6/2000 |
| DE | 10004787 A1 | 3/2001 |
| DE | 19953470 A1 | 5/2001 |
| DE | 10063383 C1 | 3/2002 |
| DE | 10213043 A1 | 10/2003 |
| DE | 10213049 A1 | 10/2003 |
| EP | 0537012 A1 | 4/1993 |
| EP | 0300995 B1 | 2/1995 |
| EP | 0502068 B1 | 4/1995 |
| EP | 0638659 A3 | 4/1996 |
| EP | 0703599 B1 | 12/1997 |
| EP | 0537011 B1 | 7/1998 |
| EP | 0589599 B1 | 11/1998 |
| EP | 0586809 B1 | 3/1999 |
| EP | 0 710 429 B1 | 6/1999 |
| EP | 0969238 A1 | 1/2000 |
| EP | 1097766 A1 | 5/2001 |
| EP | 1179515 A1 | 2/2002 |
| EP | 1179516 A1 | 2/2002 |
| EP | 1186682 A2 | 3/2002 |
| EP | 0724025 B1 | 4/2002 |
| EP | 1251547 A1 | 10/2002 |
| EP | 0740710 B1 | 4/2003 |
| EP | 1365436 A2 | 11/2003 |
| EP | 1561840 A1 | 8/2005 |
| FR | 2745010 | 2/1996 |
| GB | 2 400 613 A | 10/2004 |
| JP | 01305523 | 8/1989 |
| JP | 5051753 A | 3/1993 |
| JP | 10104862 A | 4/1998 |
| JP | 11026433 A | 1/1999 |
| JP | P2003-183823 A | 7/2003 |
| WO | WO 85/00925 | 2/1985 |
| WO | WO 92/01081 | 1/1992 |
| WO | WO 96/21750 | 7/1996 |
| WO | WO 97/25451 | 7/1997 |
| WO | WO 98/42890 | 10/1998 |
| WO | WO 99/54911 | 10/1999 |
| WO | WO 99/61674 | 12/1999 |
| WO | WO 00/00766 | 1/2000 |
| WO | WO 02/20866 A1 | 3/2002 |
| WO | WO 02/27057 A2 | 4/2002 |
| WO | WO 03/006703 A1 | 1/2003 |
| WO | WO-03/097892 A2 | 11/2003 |
| WO | WO 2005/093781 A1 | 10/2005 |

OTHER PUBLICATIONS

Literature search: Power Modulation of PECVD, Source: Physics Abstracts 1984, Jun. 2, 2005.

European Search Report, Aug. 29, 2005, Application No. 04026537.3-2119 PCT, 6 pages.

European Search Report, Aug. 11, 2006, Application No. 06011554.0-1226 PCT, 10 pages.

* cited by examiner

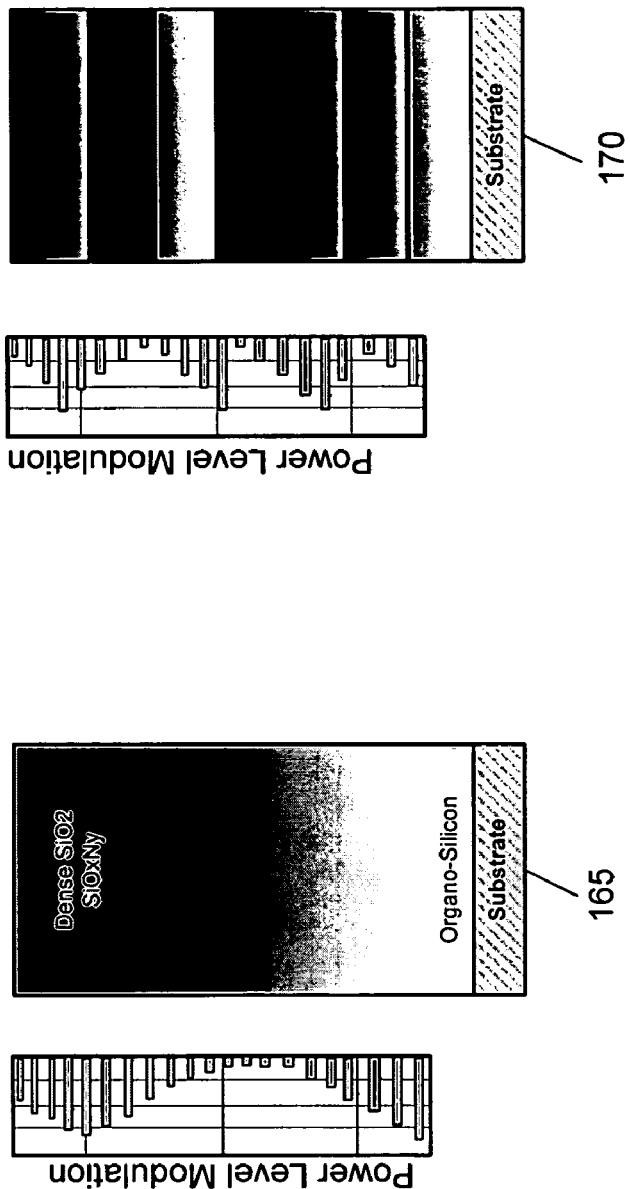

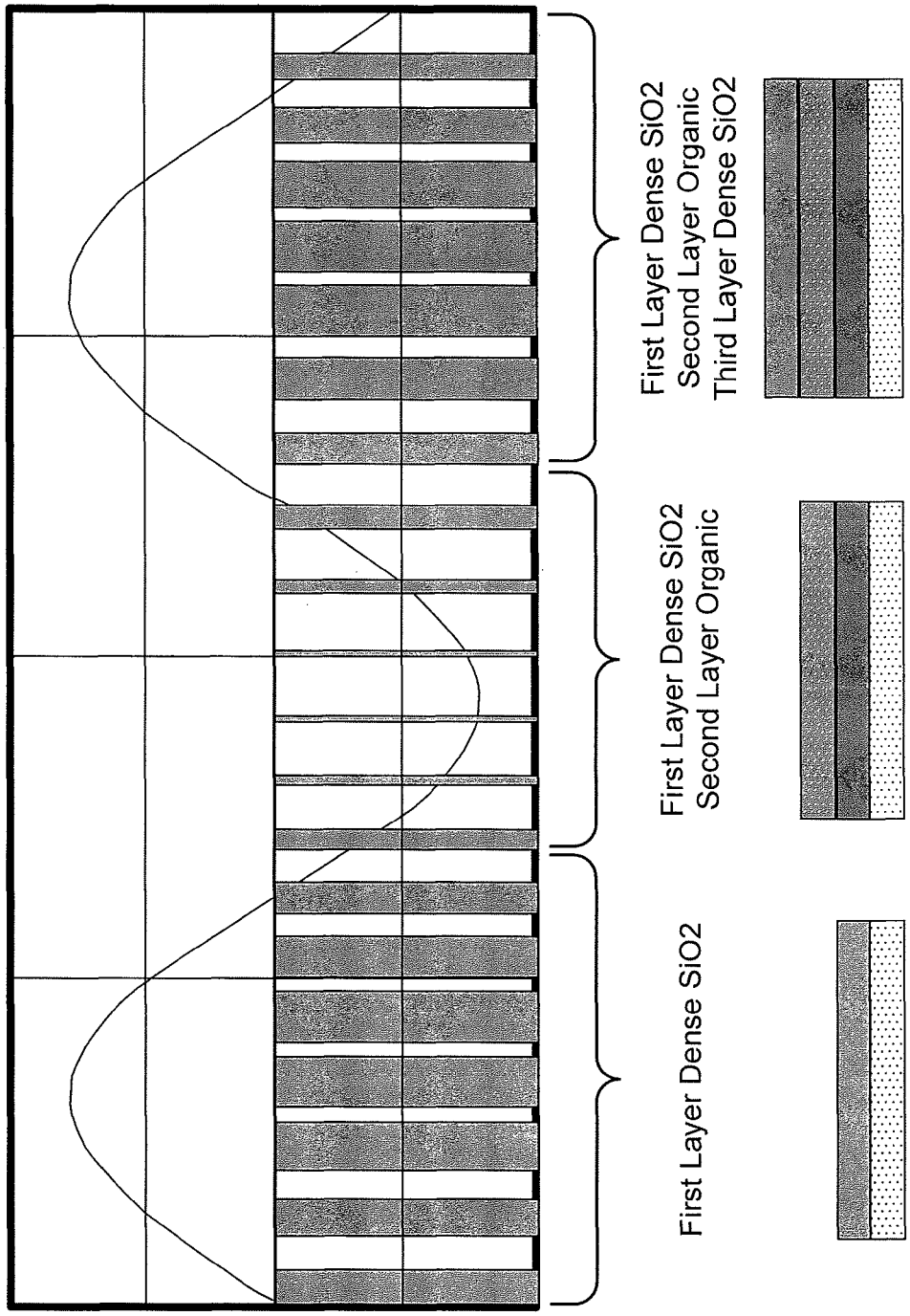

us 7,842,355 B2

SYSTEM AND METHOD FOR MODULATION OF POWER AND POWER RELATED FUNCTIONS OF PECVD DISCHARGE SOURCES TO ACHIEVE NEW FILM PROPERTIES

FIELD OF THE INVENTION

The present invention relates to power supplies, systems, and methods for chemical vapor deposition.

BACKGROUND OF THE INVENTION

Chemical vapor deposition (CVD) is a process whereby a film is deposited on a substrate by reacting chemicals together in the gaseous or vapor phase to form a film. The gases or vapors utilized for CVD are gases or compounds that contain the element to be deposited and that may be induced to react with a substrate or other gas(es) to deposit a film. The CVD reaction may be thermally activated, plasma induced, plasma enhanced or activated by light in photon induced systems.

CVD is used extensively in the semiconductor industry to build up wafers. CVD can also be used for coating larger substrates such as glass and polycarbonate sheets. Plasma enhanced CVD (PECVD), for example, is one of the more promising technologies for creating large photovoltaic sheets, LCD screens, and polycarbonate windows for automobiles.

FIG. 1 illustrates a cut away of a typical PECVD system 100 for large-scale deposition processes—currently up to 2.5 meters wide. This system includes a vacuum chamber 105 of which only two walls are illustrated. The vacuum chamber 105 houses a linear discharge tube 110. The linear discharge tube 110 is formed of an inner conductor 115 that is configured to carry a microwave signal, or other signals, into the vacuum chamber 105. This microwave power radiates outward from the linear discharge antenna 115 and ignites the surrounding support gas 120 that is introduced through the support gas tube 120. This ignited gas is a plasma and is generally adjacent to the linear discharge tube 110. Radicals generated by the plasma and electromagnetic radiation disassociate the feedstock gas(es) 130 introduced through the feedstock gas tube 125 thereby breaking up the feedstock gas to form new molecules. Certain molecules formed during the dissociation process are deposited on the substrate 135. The other molecules formed by the dissociation process are waste and are removed through an exhaust port (not shown)—although these molecules tend to occasionally deposit themselves on the substrate. This dissociation process is extremely sensitive to the amount of power used to generate the plasma.

To coat large substrate surface areas rapidly, a substrate carrier (not shown) moves the substrate 135 through the vacuum chamber 105 at a steady rate, although the substrate 135 could be statically coated in some embodiments. As the substrate 135 moves through the vacuum chamber 105, the dissociation should continue at a steady rate and target molecules from the disassociated feed gas theoretically deposit on the substrate, thereby forming a uniform film on the substrate. But due to a variety of real-world factors, the films formed by this process are not always uniform.

Nonconductive and conductive films deposited utilizing plasma enhanced chemical vapor sources have been achieved with many types of power sources and system configurations. Most of these sources utilize microwaves, radio frequency (RF), high frequency (HF), or very high frequency (VHF) energy to generate the excited plasma species.

Those of skill in the art know that for a given process condition and system configuration of PECVD, it is the average power introduced into the plasma discharge that is a major contributing factor to the density of radicalized plasma species produced. These radicalized plasma species are responsible for disassociating the feedstock gas. For typical PECVD processes, the necessary density of produced radicalized species from the plasma must be greater than that required to fully convert all organic materials. Factors such as consumption in the film deposition processes, plasma decomposition processes of the precursor materials, recombination losses, and pumping losses should be taken into consideration.

Depending upon the power type, configuration and materials utilized, the required power level for producing the necessary density of radicalized plasma species can unduly heat the substrate beyond its physical limits, and possibly render the films and substrate unusable. This primarily occurs in polymer material substrates due to the low melting point of the material.

To reduce the amount of heat loading of the substrate, a method of high power pulsing into the plasma, with off times in between the pulsing, can be used. This method allows the plasma during the short high energy pulses to reach saturation of the radicalized species required for the film deposition process and loss to occur, while reducing the instantaneous and continuous heating of the substrate through the reduction of other forms of electromagnetic radiation.

Film property requirements are achieved by setting the process conditions for deposition, including the power levels, pulsing frequency and duty cycle of the source. To achieve required film properties the structure and structural content of the deposited film must be controlled. The film properties can be controlled by varying the radical species content, (among other important process parameters), and as stated in the above, the radical density is controlled primarily by the average and peak power levels into the plasma discharge.

To achieve several important film properties, and promote adhesion to some types of substrates, the films organic content must be finely controlled, or possibly the contents must be in the form of a gradient across the entire film thickness. Current technology, which enables control of only certain process parameters, cannot achieve this fine control. For example, current technology consists of changing the deposition conditions, usually manually or by multiple sources and chambers with differing process conditions, creating steps in the film stack up to achieve a gradient type stack. Primarily the precursor vapor content, system pressure, and or power level at one or more times is used to develop a stack of layers. These methods are crude at best and do not enable fine control. Accordingly, a new system and method are needed to address this and other problems with the existing technology.

SUMMARY OF THE INVENTION

Exemplary embodiments of the present invention that are shown in the drawings are summarized below. These and other embodiments are more fully described in the Detailed Description section. It is to be understood, however, that there is no intention to limit the invention to the forms described in this Summary of the Invention or in the Detailed Description. One skilled in the art can recognize that there are numerous modifications, equivalents and alternative constructions that fall within the spirit and scope of the invention as expressed in the claims.

One embodiment includes generating a first electrical pulse having a first pulse amplitude; using the first electrical pulse to generate a first density of radicalized species; disassociating a feedstock gas using the radicalized species in the first density of radicalized species, thereby creating a first deposition material; depositing the first deposition material on a substrate; generating a second electrical pulse having a second pulse amplitude, wherein the second pulse amplitude is different from the first pulse amplitude; using the second electrical pulse to generate a second density of radicalized species; disassociating a feedstock gas using the radicalized species in the second density of radicalized species, thereby creating a second deposition material; and depositing the second plurality of deposition materials on the first deposition material.

BRIEF DESCRIPTION OF THE DRAWINGS

Various objects and advantages and a more complete understanding of the present invention are apparent and more readily appreciated by reference to the following Detailed Description and to the appended claims when taken in conjunction with the accompanying Drawing wherein:

FIG. 7a illustrates one example of a gradient film formed using amplitude-width modulation;

FIG. 7b illustrates one example of a multi-layer gradient film formed using amplitude-width modulation; and FIGS. 8a-8d illustrate the development of a multi-layer gradient film over time using a pulse-width modulated power signal.

DETAILED DESCRIPTION

In some PECVD processes the typical radical lifetime (time for the loss of and consumption of the radical species) is long enough so that there can be an off time of the plasma during which the radical density remaining is gradually consumed by the deposition of the film and loss mechanisms. Therefore, by controlling the total radical density during these on and off times of the plasma the chemical makeup of the film can be altered, as well as the over all layer properties of the film.

By modulating the power level into the plasma, the on time of the plasma and the timing between the power pulses, the user can make films that were not achievable before in PECVD. The layers could be a single gradient layer or a multiple stack of hundreds to thousands of micro layers with varying properties between each layer. Both processes can create a unique film.

Figure 1:
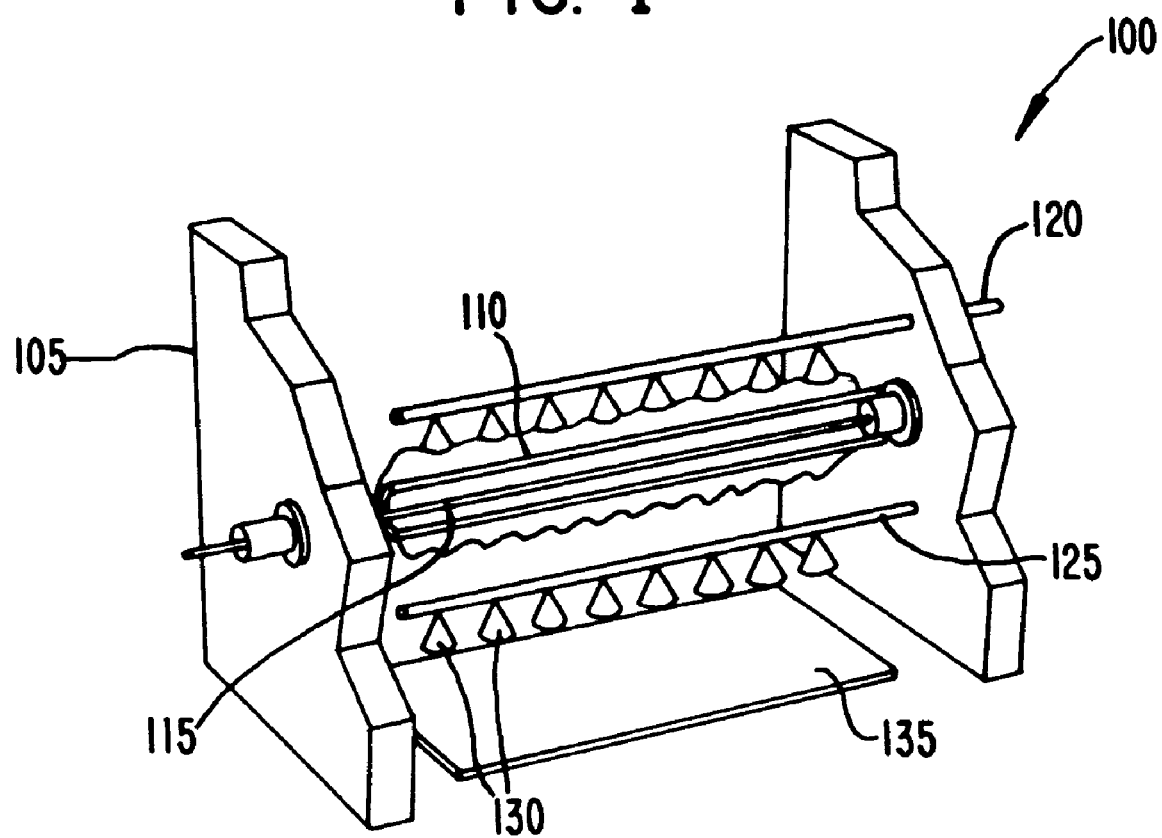
FIG. 1 illustrates one type of PECVD system.
Figure 2A:
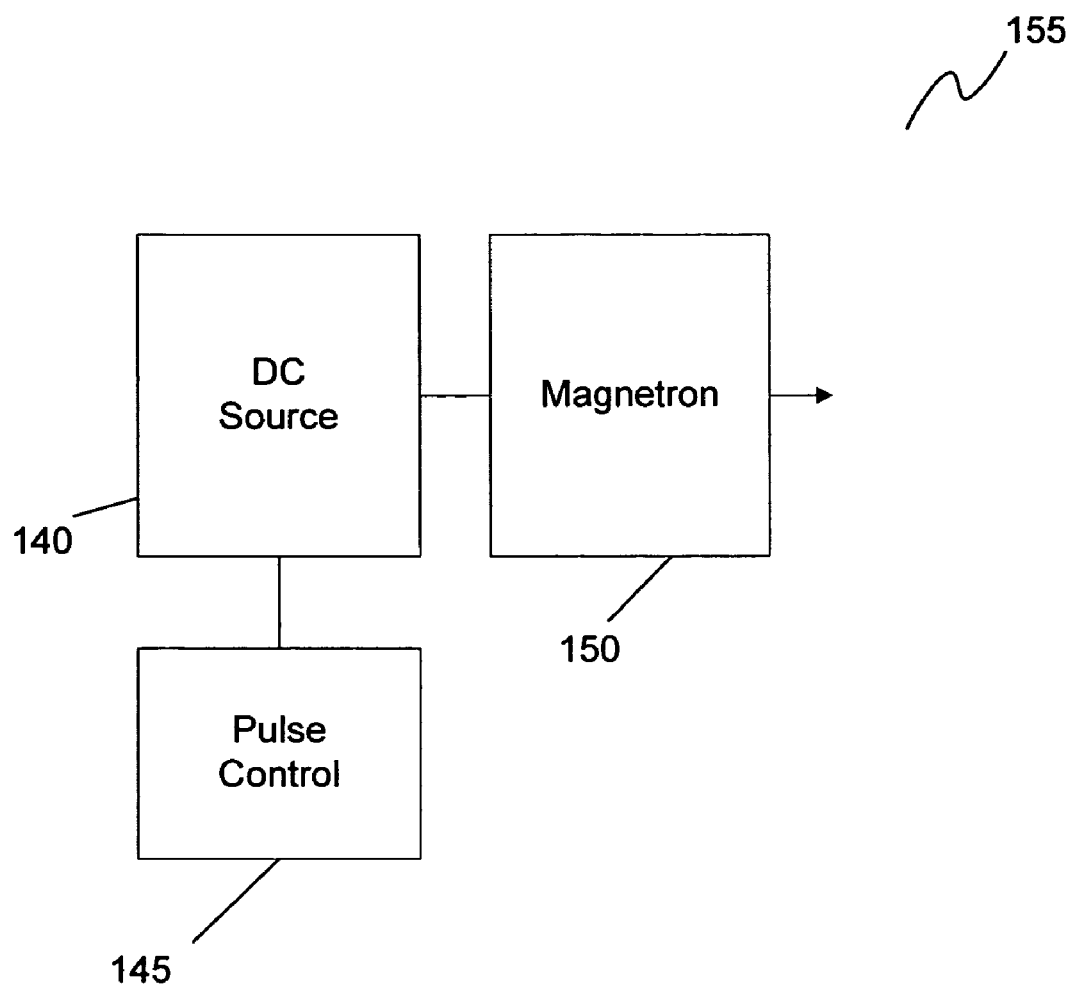
FIG. 2a illustrates a power supply for a PECVD system in accordance with one embodiment of the present invention.

FIG. 2a illustrates a system constructed in accordance with one embodiment of the present invention. This system includes a DC source 140 that is controllable by the pulse control 145. The terms "DC source" and "DC power supply" refer to any type of power supply, including those that use a linear amplifier, a non-linear amplifier, or no amplifier. The DC source 145 powers the magnetron 150, which generates the microwaves, or other energy waves, that drive the inner conductor within the linear discharge tube (not shown). The pulse control 145 can contour the shape of the DC pulses and adjust the set points for pulse properties such as duty cycle, frequency, and amplitude. The process of contouring the shape of the DC pulses is described in the commonly owned, entitled "SYSTEM AND METHOD FOR POWER FUNCTION RAMPING OF MICROWAVE LINEAR DISCHARGE SOURCES," which is incorporated herein by reference.

The pulse control 145 is also configured to modulate the DC pulses, or other energy signal, driving the magnetron 150 during the operation of the PECVD device. In some embodiments, the pulse control 145 can be configured to only modulate the signal driving the magnetron 150. In either embodiment, however, by modulating the DC pulses, the power level into the plasma can also be modulated, thereby enabling the user to control radical density and make films that were not achievable before in PECVD. This system can be used to form variable, single gradient layers or a multiple stack of hundreds to thousands of micro layers with varying properties between each other.

Figure 2B:
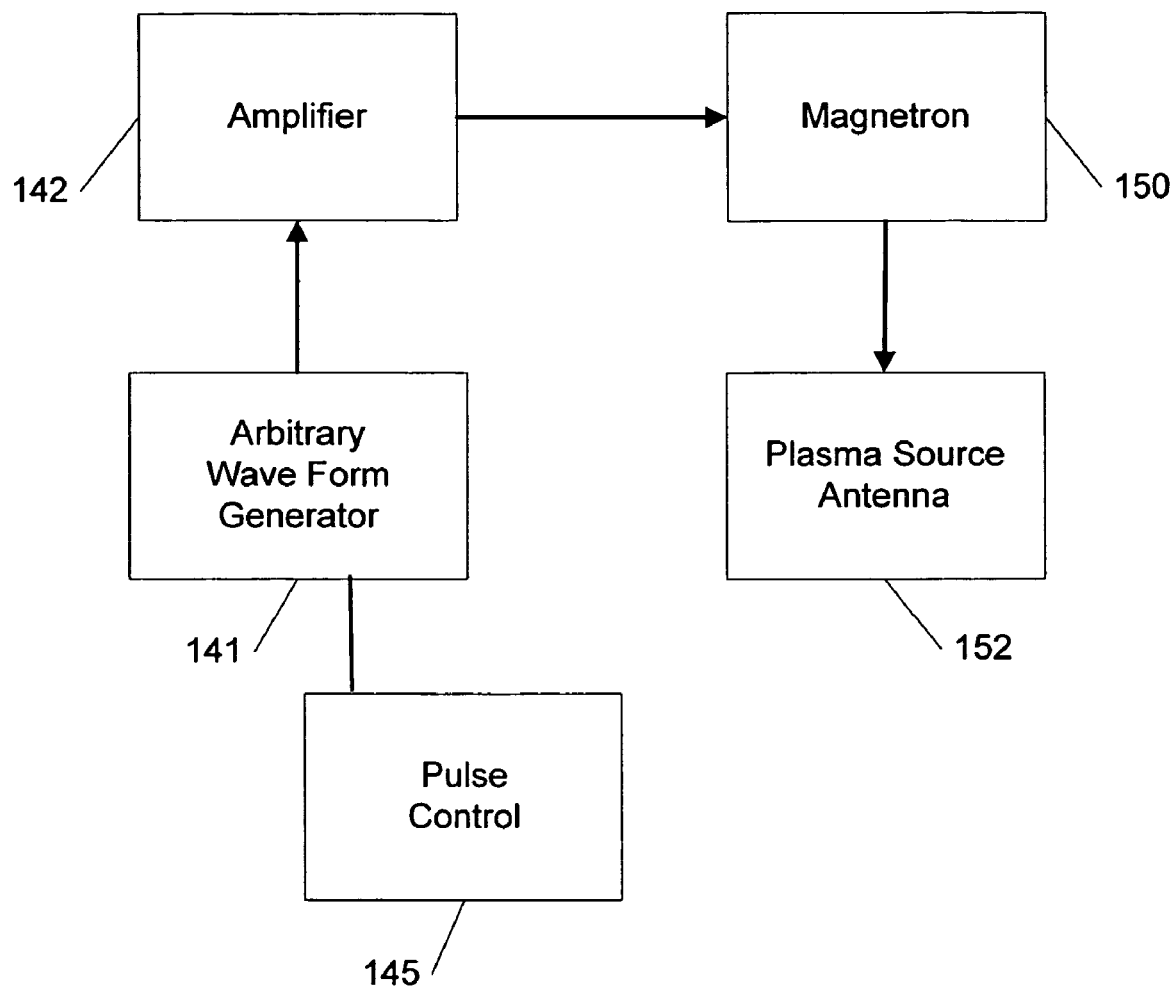
FIG. 2b is an alternative depiction of a power supply for a PECVD system in accordance with one embodiment of the present invention.

FIG. 2b illustrates an alternate embodiment of a power supply. This embodiment includes an arbitrary waveform generator 141, an amplifier 142, a pulse control 145, a magnetron 150, and a plasma source antenna 152. In operation, the arbitrary waveform generator 141 generates a waveform and corresponding voltage that can be in virtually any form. Next, the amplifier 142 amplifies the voltage from the arbitrary waveform generator to a usable amount. In the case of a microwave generator (e.g., the magnetron 150) the signal could be amplified from +/_5 VDC to 5,000 VDC. Next, the high voltage signature is applied to the magnetron 150, which is a high frequency generator. The magnetron 150 generates a power output carrier (at 2.45 GHZ in this case) that has its amplitude and or frequency varied based upon the originally generated voltage signature. Finally, the output from the magnetron is applied to the source 152 to generate a power modulated plasma.

Signal modulation can be applied by the pulse control 145 to the arbitrary waveform generator 141. Signal modulation is a well-known process in many fields—the most well known being FM (frequency modulated) and AM (amplitude modulated) radio. But modulation has not been used before to control film properties and create layers during PECVD. Many forms of modulation exist that could be applied to a waveform power level, duty cycle or frequency, but only a few are described below. Those of skill in the art will recognize other methods. Note that modulation is different from simply increasing or decreasing the power or duty cycle of a power signal into a source.

Figure 3:
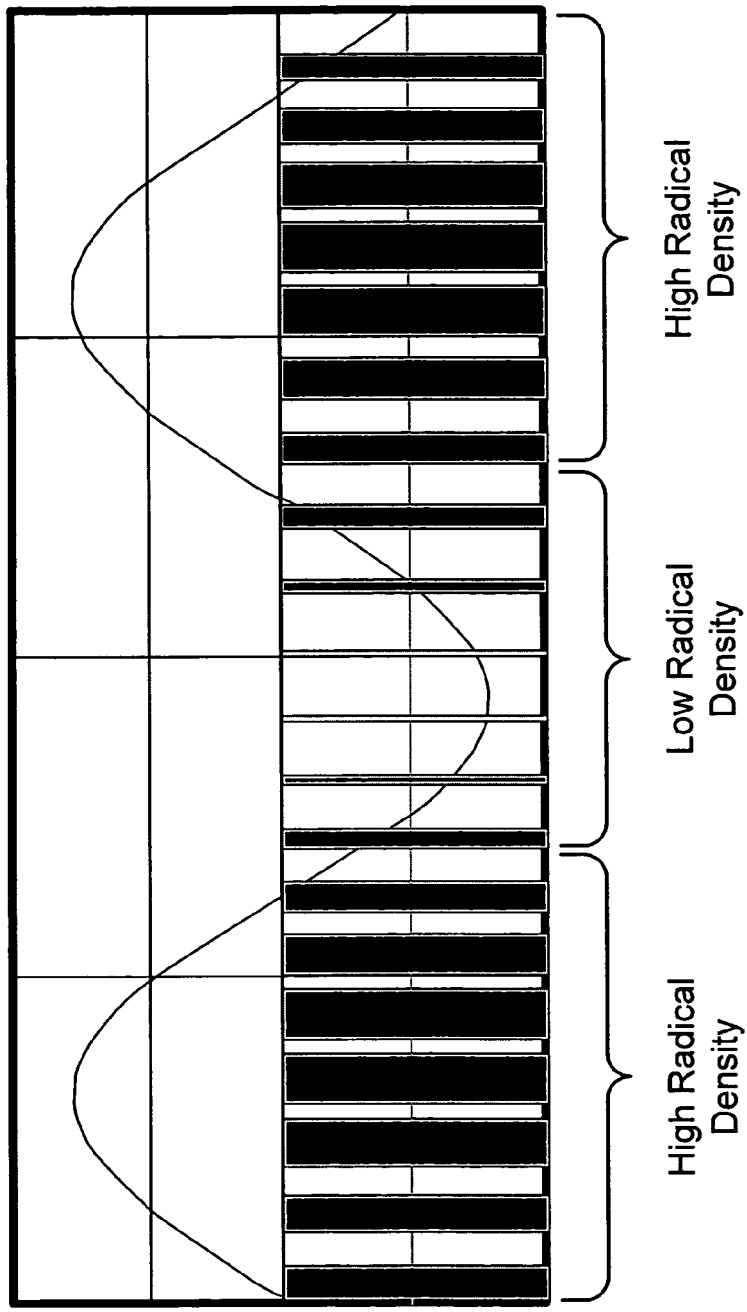
FIG. 3 illustrates one example of a pulse-width modulated power signal.

FIG. 3 illustrates pulse-width modulation, which varies the width of pulse widths over time. With pulse-width modulation, the value of a sample of data is represented by the length of a pulse.

Figure 4:
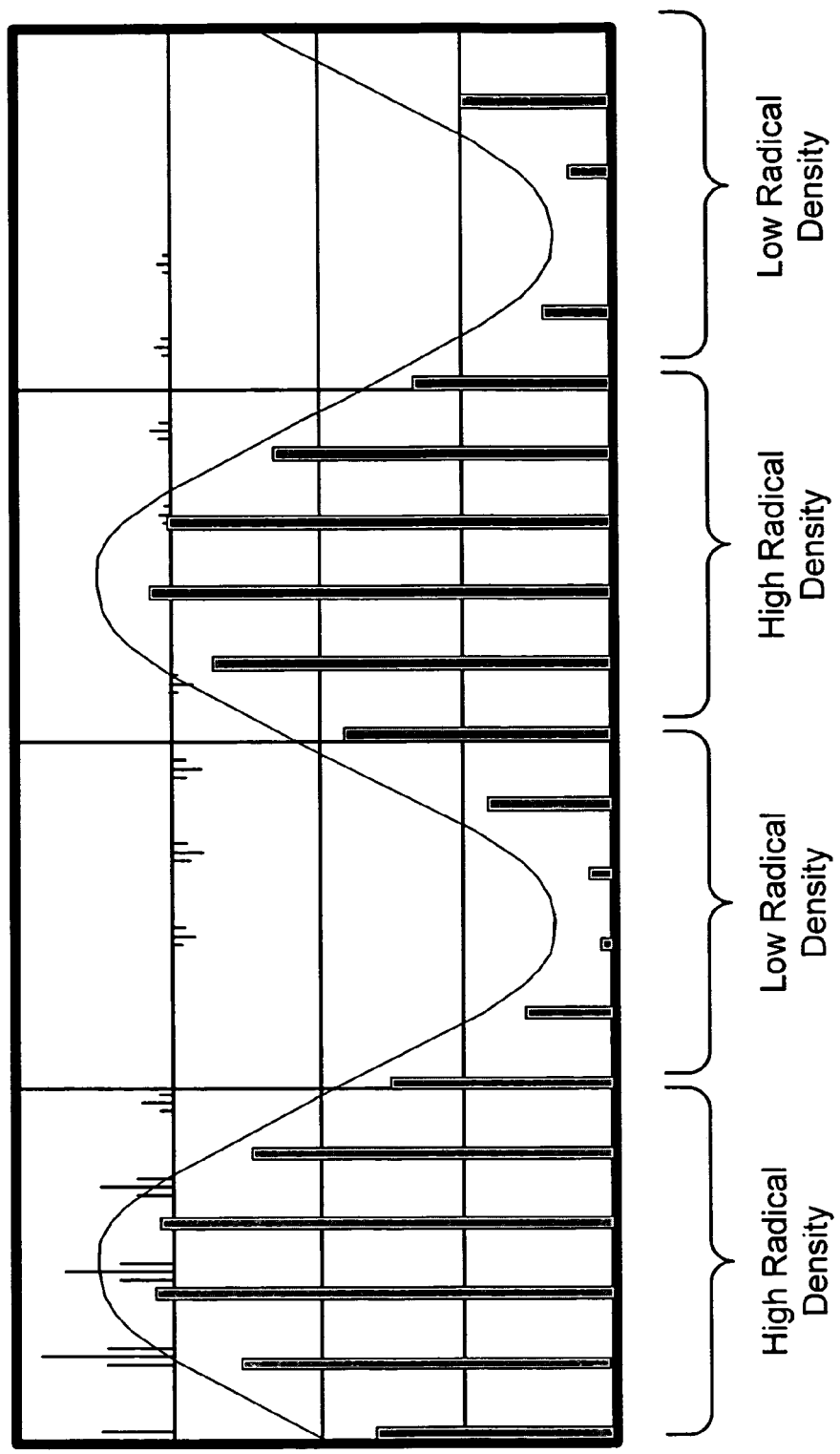
FIG. 4 illustrates one example of a pulse-amplitude modulated power signal.

FIG. 4 illustrates pulse-amplitude modulation, which is a form of signal modulation in which the message information is encoded in the amplitude of a series of signal pulses. In the case of plasma sources the voltage, current or power level can be amplitude modulated by whatever percentage desired.

Figure 5:
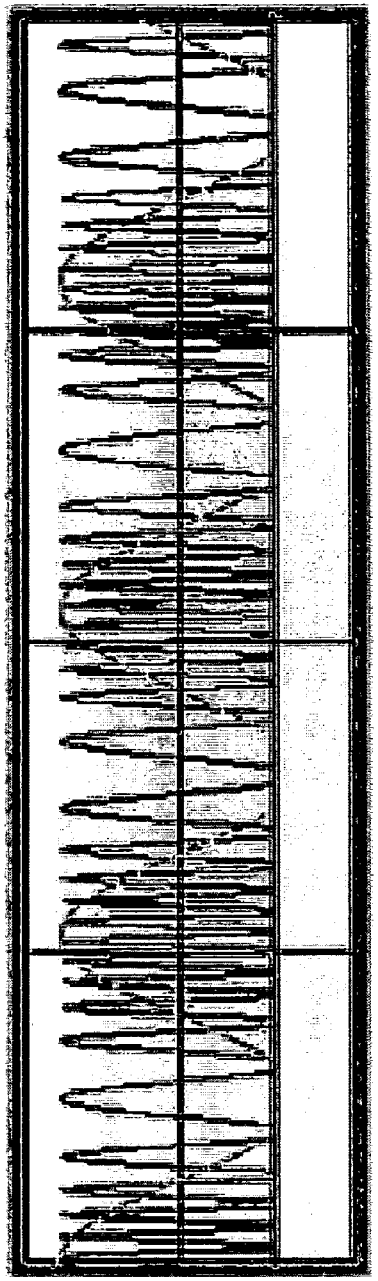
FIG. 5 illustrates one example of a frequency-modulated power signal.

FIG. 5 illustrates frequency modulation (FM), which is the encoding of information in either analog or digital form into a carrier wave by variation of its instantaneous frequency in accordance with an input signal.

Referring now to FIGS. 6 and 7, they show two examples of multi-layer films that could be produced with two differing forms of modulation, pulse-width and pulse-amplitude modulation. Both of these figures illustrate the film layers deposited on the substrate and the corresponding modulated power signal that is used to generate the plasma. Notice that the power signal is modulated during the deposition process, which differs from establishing and leaving initial set points that are static during the deposition process.

Figures 6A, 6B:
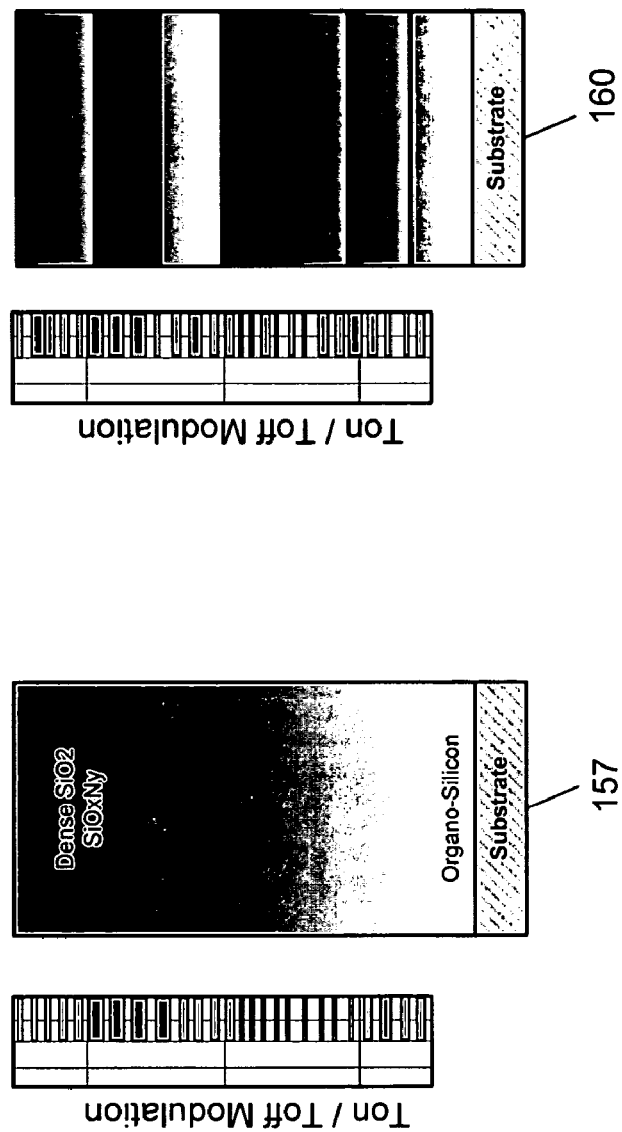
FIG. 6a illustrates one example of a gradient film formed using pulse-width modulation.
FIG. 6b illustrates one example of a multi-layer gradient film formed using pulse-width modulation.

Referring first to FIG. 6a, it illustrates a variable film 157 produced by pulse-width modulation. In this embodiment, the cycle between short pulse widths and long pulse widths is relatively long. This long cycle produces a variable-gradient coating on the substrate that varies through its thickness from a flexible, organo-silicon film located next to the substrate to a rigid, dense SiO2 or SiOxNy film. The film produced by this process becomes harder and more rigid as it extends out from the substrate.

A benefit is realized with this single, variable gradient layer because the flexible, softer portion of the film bonds better to the substrate than would the dense, rigid portion. Thus, the pulse width modulation allows a film to be created that bonds well with the substrate but also has a hardened outer portion that resists scratches and that has good barrier properties. This type of film could not be efficiently created without a modulated power signal.

By changing the modulation of the power signal, a multi-layer gradient coating can be deposited on the substrate. FIG. 6b illustrates this type of substrate and film 160. In this embodiment, the cycle between short pulse widths and long pulse widths is relatively short, thereby creating multiple layers. These individual layers can also vary from less dense to more dense within a single layer—much as the single gradient layer in FIG. 6a does.

In this embodiment, a less-dense, organo-silicon layer is initially deposited on the substrate. This type of layer bonds best with the substrate. The next layer is slightly more dense, and the third layer is an almost pure SiO2 or SiOxNy layer, which is extremely dense and hard. As the pulse width modulates to shorter pulse widths, the next layer is again a less-dense, organo-silicon layer that bonds easily to the dense layer just below. This cycle can repeat hundreds or even thousands of times to create a multilayer, gradient film that is extremely hard, resilient, and with good barrier properties. Further, this film can be produced with a minimal amount of heat and damage to the substrate.

FIGS. 7a and 7b illustrate another series of films similar to those shown in FIGS. 6a and 6b. These films, however, are created using pulse-amplitude modulation. Again, both a single gradient film 165 or a multilayer gradient film 170 can be created using modulation techniques. Note that this process works for almost any precursor and is not limited to silicon-based compounds.

Variable films can be created with other modulation techniques. In fact, there are many modulation technologies that could be implemented to effectively control the radical species density and electromagnetic radiation in relation to time, including, PWM—Pulse Width Modulation, PAM—Pulse Amplitude Modulation, PPM—Pulse Position Modulation, AM—Amplitude modulation, FM—Frequency Modulation, etc. Again, these techniques involve modulating a power signal during film deposition rather than setting an initial power point or duty cycle.

Referring now to FIGS. 8a through 8d, they show an example of pulse-width modulation and its possible affects on the films properties for SiO2 and or SiOxNy. A sine wave signal is used to drive the pulsing frequency at a fixed peak power level to increase or decrease the short term average power into the plasma. The sine wave shown is the drive signal, and it also indicates power.

At the beginning portion (left side) of the FIG. 8a, the modulation increases the power level per given time interval by increasing the on-time and decreasing the off-time of the plasma, thus increasing the instantaneous radical density and electromagnetic components of the plasma. This process increases the radical density to the point at which all material was converted and deposited and a new material is the dominate contributor to the growing film stack, SiO2 or SiOxNy. FIG. 8b shows the dense layer formed next to the substrate during this phase.

In the center of the drive signal, the on-time is at its lowest and off-time at its highest value. This effect decreases the instantaneous radical density to the point at which all material was consumed and the precursor material again becomes the dominate contributor to the growing film stack. FIG. 8c shows the less-dense, more-organic layer formed during the second phase. This layer is deposited on the first layer.

Finally in the last portion of the waveform, the process returns to saturation of the radical density like in the first portion of the waveform. This phase deposits a hardened, dense layer. FIG. 8d shows the dense, third layer deposited on the second layer. Accordingly, the three phases together leaving an inter layer of organic material between two hard, dense layers—thereby introducing flexibility into the entire film stack.

These modulation techniques can be used during inline or dynamic deposition processes. By utilizing these modulation techniques with the dynamic deposition process, it is possible to produce alignment layers for applications such as LCD displays, thereby replacing the polymide layers presently being used.

In summary, this discovery allows the user to achieve PECVD films not possible in the past, possibly with extended film properties and qualities not possible to date. The higher quality thin films are achieved from the ability to actively control the plasmas radical/electromagnetic radiation densities in continuous way per unit time by contouring the average and or peak power level per time interval. The drive waveform can be any waveform or even an arbitrary function. This technique can also be used to control the localized etching rate when the source and system is configured to do so.

In conclusion, the present invention provides, among other things, a system and method for controlling deposition onto substrates. Those skilled in the art can readily recognize that numerous variations and substitutions may be made in the invention, its use and its configuration to achieve substantially the same results as achieved by the embodiments described herein. Accordingly, there is no intention to limit the invention to the disclosed exemplary forms. Many variations, modifications and alternative constructions fall within the scope and spirit of the disclosed invention as expressed in the claims.

What is claimed is:

1. A method of controlling a chemical vapor deposition process, the method comprising:
    generating a drive signal;
    providing the drive signal to a direct current power source;
    generating a pulsed direct current power signal using the direct current power source, wherein a frequency or a pulse-width of the pulsed direct current power signal is modulated in accordance with derived from an amplitude of the drive signal;

generating a first plasma having a first density of radicalized species, wherein the first plasma is generated using the pulsed direct current power signal during a first phase of the drive signal;

disassociating a first portion of a feedstock gas using the radicalized species in the first density of radicalized species, thereby creating a first deposition material;

depositing at least a portion of the first deposition material on a substrate, thereby forming a first layer;

generating a second plasma having a second density of radicalized species, wherein the second plasma is generated using the pulsed direct current power signal during a second phase of the drive signal, the first phase of the drive signal being modulated differently than the second phase of the drive signal;

disassociating a second portion of the feedstock gas using the radicalized species in the second density of radicalized species, thereby creating a second deposition material; and depositing at least a portion of the second deposition material on the first layer, thereby forming a second layer.

2. The method of claim 1, further comprising:

generating a third plasma having a third density of radicalized species, wherein the third plasma is generated using the pulsed direct current power signal during a third phase of the drive signal, the third phase of the drive signal being modulated differently than the second phase of the drive signal;

disassociating a third portion of the feedstock gas using the third density of radicalized species, thereby creating a third deposition material; and depositing at least a portion of the third deposition material on the second layer, thereby forming a third layer.

3. The method of claim 1, wherein the first layer and the second layer comprise separate layers of deposition material within a film deposited on the substrate.

4. The method of claim 1, wherein the first layer and the second layer comprise a single gradient stack deposited on the substrate.

5. The method of claim 1, wherein the pulsed direct current power signal comprises a high-frequency signal for generating the plasma.

6. The method of claim 1, wherein the drive signal is controlled during deposition to modulate the pulsed direct current power signal.

7. The method of claim 2, wherein the third density of radicalized species is different from the first density of radicalized species and the second density of radicalized species.

8. The method of claim 1, further comprising providing the pulsed direct current power signal to a magnetron, wherein the magnetron generates a microwave power signal which generates the first plasma and the second plasma.

9. The method of claim 1, wherein the generating the drive signal comprises:

generating a sinusoidal waveform drive signal.

10. A method of generating a film during a chemical vapor deposition process, the method comprising:

generating a drive signal, wherein a waveform of the drive signal is a sinusoidal wave;

using a first series of direct current power pulses to generate a plasma with a first density of radicalized species, wherein a modulation of the first series of direct current power pulses is derived from a first phase of the drive signal;

disassociating a first portion of a feedstock gas using the radicalized species in the first density of radicalized species, thereby creating a first deposition material;

depositing at least a portion of the first deposition material on a substrate to form a first layer;

using a second series of direct current power pulses to create a second density of radicalized species within the plasma, wherein a modulation of the second series of direct current power pulses is derived from a second phase of the drive signal;

disassociating a second portion of the feedstock gas using the radicalized species in the second density of radicalized species, thereby creating a second deposition material; and depositing the second deposition materials on the first layer.

11. The method of claim 10, further comprising:

providing the drive signal to a direct current power generator.

12. The method of claim 1, wherein generating the drive signal comprises:

generating the drive signal using an arbitrary waveform generator.

13. The method of claim 10, wherein using the first series of direct current power pulses to generate the plasma with the first density of radicalized species comprises:

generating a high-frequency signal using the first series of electrical pulses.

14. The method of claim 13, wherein using the first series of direct current power pulses to generate the plasma with the first density of radicalized species comprises:

introducing the high-frequency signal into a deposition chamber; and generating the plasma within the deposition chamber using the high-frequency signal.

15. The method of claim 10, wherein the modulation of the first series of direct current power pulses comprises modulation of a characteristic of the first series of direct current power pulses, the characteristic selected from the group consisting of an amplitude characteristic, a frequency characteristic, or a pulse width characteristic.

16. The method of claim 10, wherein the density of radicalized species in the second density of radicalized species is lower than the density of radicalized species in the first density of radicalized species.

17. The method of claim 10, wherein the average pulse width per unit time during the first phase of the drive signal is lower than the average pulse width per unit time for the second phase of the drive signal.

18. The method of claim 10, wherein the average pulse amplitude per unit time during the first phase of the modulated drive signal is higher than the average pulse amplitude per unit time for the second phase of the modulated drive signal.

19. The method of claim 10, wherein the average pulse frequency during the first phase of the modulated drive signal is lower than the average pulse frequency for the second phase of the modulated drive signal.

20. The method of claim 1, wherein the drive signal is a non-uniformly varying drive signal.

21. A method of generating a film during a chemical vapor deposition process, the method comprising:

generating a pulse control signal;

providing the pulse control signal to a direct current source;

generating a first series of power pulses having a first average pulse width, wherein the first series of power pulses is generated by the direct current source during a first phase of the pulse control signal, and wherein a pulse width of each pulse in the first series of power pulses is derived from the amplitude of the pulse control signal during the first phase;

using the first series of power pulses, generating a first density of radicalized species;

disassociating a first portion of a feedstock gas using the first density of radicalized species, thereby creating a first plurality of deposition materials;

depositing the first plurality of deposition materials on a substrate as a first layer;

generating a second series of power pulses having a second average pulse width, wherein the second average pulse width is different from the first average pulse width, and wherein the second series of power pulses is generated by the direct current source during a second phase of the pulse control signal, and wherein a pulse width of each pulse in the second series of power pulses is derived from the amplitude of the waveform pulse control signal during the second phase;

using the second series of power pulses, generating a second density of radicalized species;

disassociating a second portion of a feedstock gas using the radicalized species in the second density of radicalized species, thereby creating a second plurality of deposition materials; and depositing the second plurality of deposition materials on the first layer.

* * * * *